United States Patent [19]
Tustaniwskyi et al.

[11] Patent Number: 5,724,229
[45] Date of Patent: Mar. 3, 1998

[54] ELECTROMECHANICAL ASSEMBLY HAVING A LID WHICH PROTECTS IC CHIPS AND HOLDS CONTACT SPRINGS

[75] Inventors: Jerry Ihor Tustaniwskyi, Mission Viejo; Leonard Harry Alton, Escondido; Ronald Jack Kuntz, San Diego; Ronald Allen Norell, Oceansice, all of Calif.

[73] Assignee: Unisys Corporation, Blue Bell, Pa.

[21] Appl. No.: 623,389

[22] Filed: Mar. 27, 1996

[51] Int. Cl.$^6$ .................................................. H05K 7/20
[52] U.S. Cl. .................... 361/719; 361/774; 361/787; 439/66
[58] Field of Search ................ 257/690, 692, 257/693, 698, 704, 706, 707, 712, 713; 174/16.3, 252, 52.4; 439/55, 64–74, 66; 165/80.3, 185; 361/704, 705, 707, 709, 712, 761, 717–719, 764, 767, 772, 774, 777, 778, 784, 785, 787, 789

[56] References Cited

U.S. PATENT DOCUMENTS

| | | | |
|---|---|---|---|
| 3,685,002 | 8/1972 | Kennedy | 339/17 CF |
| 4,381,131 | 4/1983 | Demnianiuk | 339/75 M |
| 4,875,140 | 10/1989 | Delpech | 361/789 |
| 5,075,765 | 12/1991 | Norell | 357/74 |
| 5,341,564 | 8/1994 | Akhavain | 29/832 |
| 5,353,191 | 10/1994 | Volz | 361/690 |
| 5,388,998 | 2/1995 | Grange | 439/66 |
| 5,400,220 | 3/1995 | Swamy | 361/760 |
| 5,473,510 | 12/1995 | Dozier, II | 361/719 |
| 5,611,696 | 3/1997 | Donner | 439/66 |

*Primary Examiner*—Gerald P. Tolin
*Attorney, Agent, or Firm*—Charles J. Fassbender; Mark T. Starr; Steven R. Petersen

[57] ABSTRACT

A pressure-mountable, electro-mechanical assembly includes a housing which holds an integrated circuit chip in an open cavity; and, the housing has conductors that connect the chip to a pattern of metal pads on an exterior surface of the housing. A lid lies on the exterior surface of the housing, covers the cavity, and has terminal holes that match and expose the pattern of metal pads. Respective conductive springs are held in the terminal holes, contact the metal pads, and project from the lid. This lid operates as both a protective cover for the chip and a carrier for the springs.

9 Claims, 4 Drawing Sheets

ELECTROMECHANICAL ASSEMBLY HAVING A LID WHICH PROTECTS IC CHIPS AND HOLDS CONTACT SPRINGS

BACKGROUND OF THE INVENTION

This invention relates to the structure of electromechanical assemblies which house integrated circuit chips; and more particularly, it relates to the structure of such assemblies which are pressure mountable directly to a printed circuit board without any interposer connector lying therebetween.

In the prior art, many electromechanical assemblies are disclosed which house integrated circuit chips and which are directly mountable to a printed circuit board through the use of solder (as opposed to pressure). Examples of these assemblies are described in U.S. Pat. No. 5,075,765 entitled "Low Stress Multi Chip Module" and U.S. Pat. No. 5,341,564 entitled "Method of Fabricating Integrated Circuit Module." Both of these patents are assigned to the assignee of the present invention.

Patent '765, discloses an assembly in which a substrate 20 has one surface that holds multiple integrated circuit chips 22, and has an opposite surface from which multiple input/output pins extend such that they can be soldered directly to a printed circuit board. Similarly, Patent '564 discloses an assembly in which a substrate 12b has one surface which holds multiple integrated circuit chips 11a, and has an opposite surface from which multiple input/output pins 12a extend such that they can be soldered directly to a printed circuit board.

However, one drawback of solder mountable electromechanical assemblies is that a soldered connection can crack if it is subjected to a high degree of thermally induced stress; and such cracks cause reliability problems. Also, another drawback is that, after an assembly has been soldered to a printed circuit board, it is difficult to remove without causing damage to the assembly and/or the printed circuit board. Being able to easily remove the assembly from the printed circuit board is desirable whenever a chip in the assembly becomes defective and needs to be replaced, and whenever a chip in the assembly becomes obsolete and needs to be upgraded with a newer version.

In the prior art, the above problems have been addressed by providing interposer connectors which lie between the printed circuit board and the modules that hold the integrated circuit chips. These interposer connectors carry electrical signals between the printed circuit boards and the integrated circuit chips by making pressure contacts to the input/output terminals on the module which hold the chips. An example of such a prior art interposer connector is a zero-insertion force socket, such as the one which is described in U.S. Pat. No. 4,381,131 entitled "Levered System Connector for an Integrated Circuit Package."

However, the addition of a zero insertion force socket into the assembly between the printed circuit board and the module which holds the integrated circuit chips is undesirable because it is an extra component. Requiring this extra component increases the cost of the parts in the assembly; and, it increases the labor cost in manufacturing the assembly. Also, the socket can increase the profile (i.e. height) of the overall assembly; and that in turn has both electrical and mechanical drawbacks. Electrically, the socket adds parasitic capacitance and parasitic inductance to the signal paths which travel between the integrated circuit chips and the printed circuit board; and consequently, the maximum speed at which the chips can operate is decreased. Mechanically, the socket increases the spacing between two printed circuit boards which are mounted side-by-side in a rack and interconnected via a backplane.

Another example of a prior art interposer connector, which lies between a printed circuit board and a module that holds integrated circuit chips, is a fuzz button carrier as described in the "Microelectronics Packaging Handbook" by Tummala, et al. on page 983. This carrier consists of a flat piece of insulating material through which multiple terminal holes are formed; and, each terminal hole is filled with a wad of electrically conductive springy wire called a fuzz button. Typically, the carrier is placed on the printed circuit board such that the fuzz buttons contact respective terminals on the board; the module which holds the integrated circuit chips is placed on top of the carrier such that the fuzz buttons contact respective terminals on the module; and a clamping mechanism is added which squeezes the fuzz buttons in the carrier between the terminals on the integrated circuit module and the printed circuit board.

However, the above assemblies are deficient in that the fuzz button carrier is an extra component; and that extra component increases the cost of the parts in the assembly and increases the labor cost in manufacturing the assembly. Also, the fuzz button carrier will increase the profile of the assembly whenever the height of the carrier in the assembly adds to the height of the module which holds the integrated circuit chips; and that causes the above-described electrical and mechanical drawbacks. In addition, any clamping mechanisms which extend beyond the perimeter of the fuzz buttons increase the footprint of the assemblies on the printed circuit board and thereby decrease packaging density on the board.

Accordingly, a primary object of the invention is to provide a novel, electromechanical assembly in which all of the above problems are overcome.

BRIEF SUMMARY OF THE INVENTION

An electromechanical assembly, that employs the present invention, is comprised of a housing which holds one or more integrated circuit chips in an open cavity; and the housing has conductors which connect the chips to a pattern of metal pads on an exterior surface of the housing. Further, in accordance with the invention, the electromechanical assembly includes a lid which—a) lies on the exterior surface of the housing, b) covers the open cavity to protect the chips, and c) has terminal holes that match and expose the pattern of metal pads. These terminal holes are filled with electrically conductive springs, which may be fuzz buttons, that contact the metal pads and project from the lid such that they can be pressure mounted to a printed circuit board.

With this electromechanical assembly, the lid on the housing for the chips serves two functions. Specifically, the lid operates as a protective cover for the chips and as a carrier for the contact springs. Consequently, the disclosed assembly has a reduced component cost, a reduced manufacturing cost, and a low profile. Further, the disclosed assembly has a clamping mechanism which is integrated into the assembly and lies within the perimeter of the conductive springs; and consequently, the footprint of the assembly on the printed circuit board is minimized.

DETAILED DESCRIPTION

Figure 1:
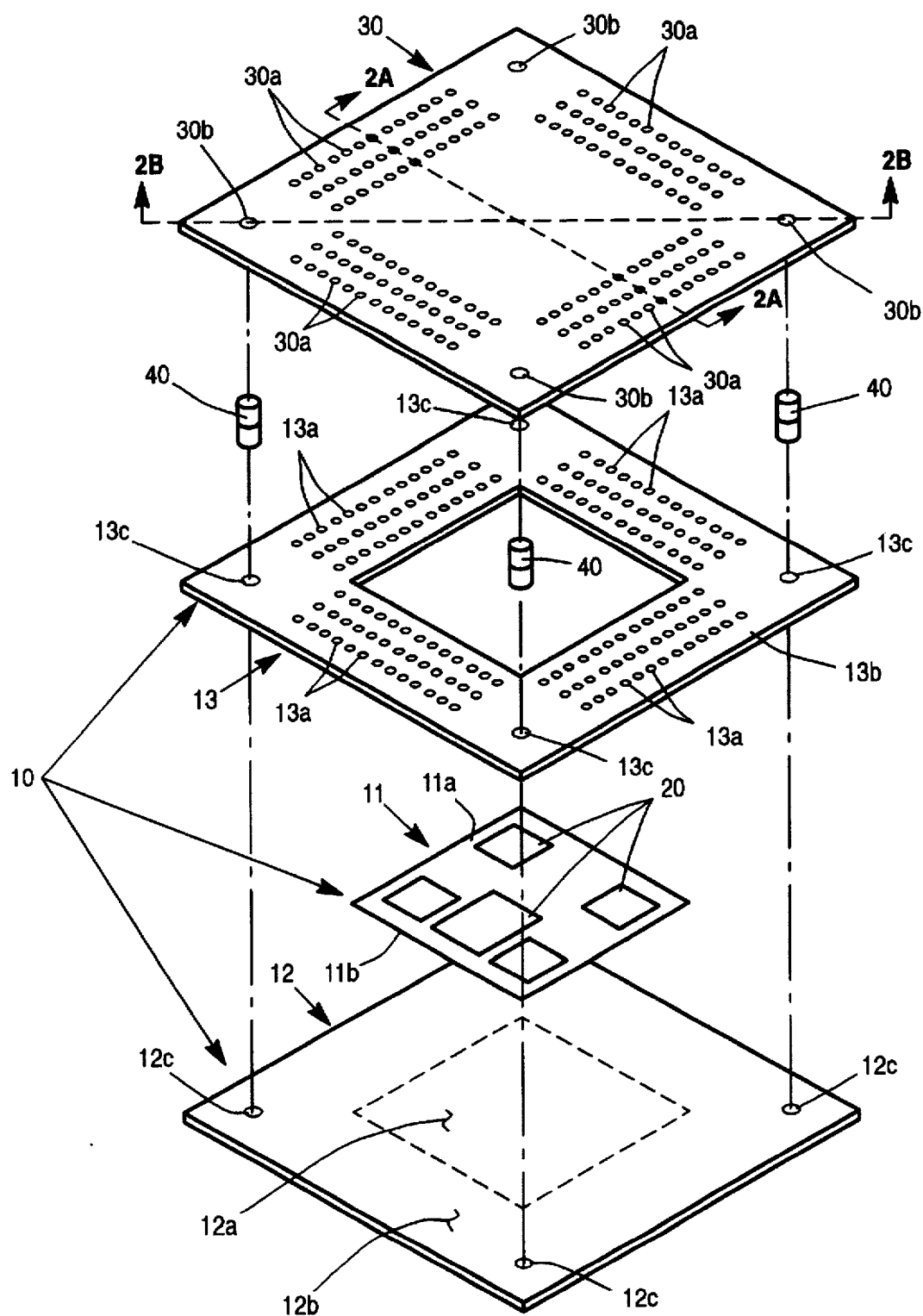
FIG. 1 is an exploded view of an electromechanical assembly which constitutes one preferred embodiment of the present invention.

Referring now to FIG. 1, the structure of a low profile, pressure-mountable, electromechanical assembly which constitutes one preferred embodiment of the present invention will be described. This FIG. 1 embodiment includes a housing 10 which is made up of a flat substrate 11, a heat spreader 12, and a ring-shaped member 13. Several integrated circuit chips 20 are mounted on a top surface 11a of the flat substrate 11; and a bottom surface 11b of the flat substrate 11 is attached by a thermally conductive adhesive to a central portion 12a of the heat spreader 12. On the remaining periphery portion 12b of the heat spreader 12, the ring shaped member 13 is attached. This ring-shaped member 13 surrounds the flat substrate 11 and thereby forms an open cavity in which the integrated circuit chips 20 are held.

Within the flat substrate 11 and the ring-shaped member 13 are hundreds of microscopic metal conductors which electrically interconnect the integrated circuit chips 20 to each other and to a pattern of metal pads 13a that lie on an exterior surface 13b of the ring-shaped member 13. These pads and conductors are too small to be illustrated fully in FIG. 1; but they are shown in greater detail in the enlarged cross-sectional views of FIGS. 2A and 3A. By using the metal pads 13a as contact points, electrical signals can be sent to and received from the integrated circuit chips 20.

Also included in the FIG. 1 module is a lid 30 which covers the cavity in which the integrated circuit chips 20 are held, and which lies on the exterior surface 13b of the ring-shaped member 13. This lid 30 has a pattern of terminal holes 30a which match and expose the pattern of metal pads 13a on the ring-shaped member 13. In order to make the terminal holes 30a line up accurately with the metal pads 13a, the lid 30 is provided with alignment holes 30b which are precisely located with respect to the terminal holes 30a, and the ring-shaped member 13 is provided with alignment holes 13c which are located identically with respect to the metal pads 13a. These alignment holes 30b and 13c are filled with alignment pins 40 which position the terminal holes 30a over the metal pads 13a.

Figure 2A:
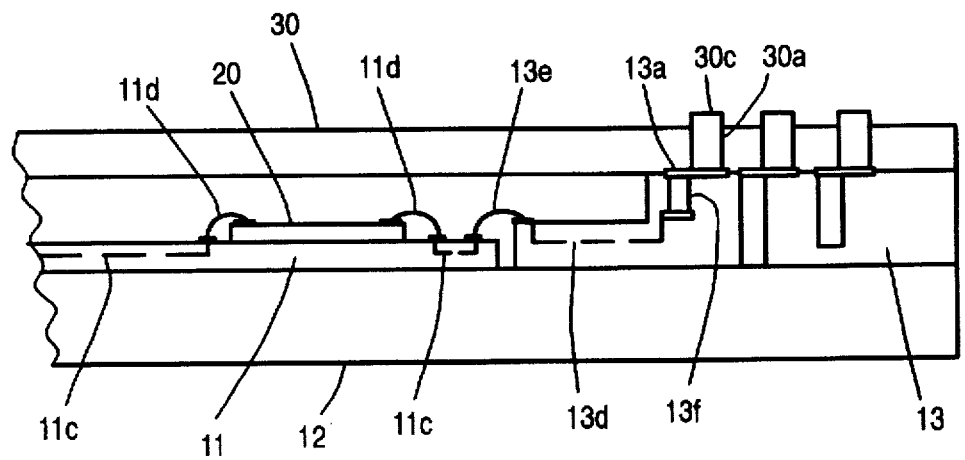
FIG. 2A is an enlarged sectional view that is taken along section line 2A—2A in FIG. 1 and which cuts vertically through the FIG. 1 assembly.
Figure 2B:
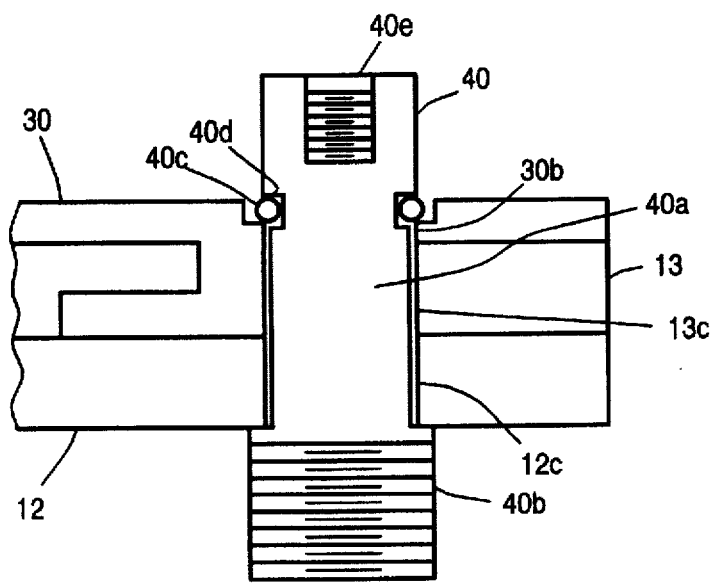
FIG. 2B is an enlarged sectional view that is taken along section line 2B—2B in FIG. 1 and which cuts vertically through the FIG. 1 assembly.

In order to describe the FIG. 1 electromechanical assembly in more detail, reference should now be made to FIGS. 2A and 2B. Those FIGS. 2A and 2B are enlarged sectional views which respectively are taken along section lines 2A and 2B in FIG. 1. Each section line 2A and 2B cuts vertically through all of the components 11, 12, 13 and 30.

Inspection of FIG. 2A shows that the microscopic metal conductors that carry electrical signals to and from each integrated circuit chip 20 have several component parts which are identified by reference numerals 11c, 11d, 13d, 13e, and 13f. Item 11c is a microscopic conductor in the flat substrate 11; item 11d is a bonding wire between the integrated circuit chip 20 and the conductor 11c; item 13d is a microscopic conductor in the ring-shaped member 13; item 13e is a bonding wire which interconnects the conductor 13d in the ring-shaped member 13 to the conductor 11c in the substrate 11; and item 13f is a metal coated via hole in the ring-shaped member 13.

For each chip 20 which is on the substrate 11, the above-described items 11c, 11d, 13e, 13d, and 13f are repeated as needed, which typically is over one-hundred times. Each metal coated via hole 13f contacts a separate metal pad 13a on the ring-shaped member 13, and each metal pad is aligned with a terminal hole 30a in the lid 30. Also as FIG. 2A shows, each terminal hole 30a holds a conductive spring 30c which contacts the metal pad 13a and which projects from the lid 30. Preferably, the conductive spring 30c consists of a wad of springy wire which presses against the side walls of the terminal hole 30a and is thereby held in place.

Inspection of FIG. 2B shows additional details of the alignment pin 40 within the electromechanical assembly of FIG. 1. Each alignment pin 40 has a narrow shaft 40a which fits snugly in corresponding alignment holes 30b, 13c, and 12c of the lid, the ring-shaped member, and the heat spreader, respectively. As a result, the conductive springs 30c are aligned with and contact the metal pads 13a as shown in FIG. 2A.

Each alignment pin also has a wide end 40b which is too large to pass through the alignment hole 12c in the heat spreader 12; and each alignment pin 40 further has a retaining ring 40c which lies against the lid 30 and catches on a groove 40d in the pin's shaft 40a. By this wide end 40b and retaining ring 40c, the lid 30 and the ring-shaped member 13 and the heat spreader 12 are mechanically held together such that they can be handled as a single unit.

Figure 3A:
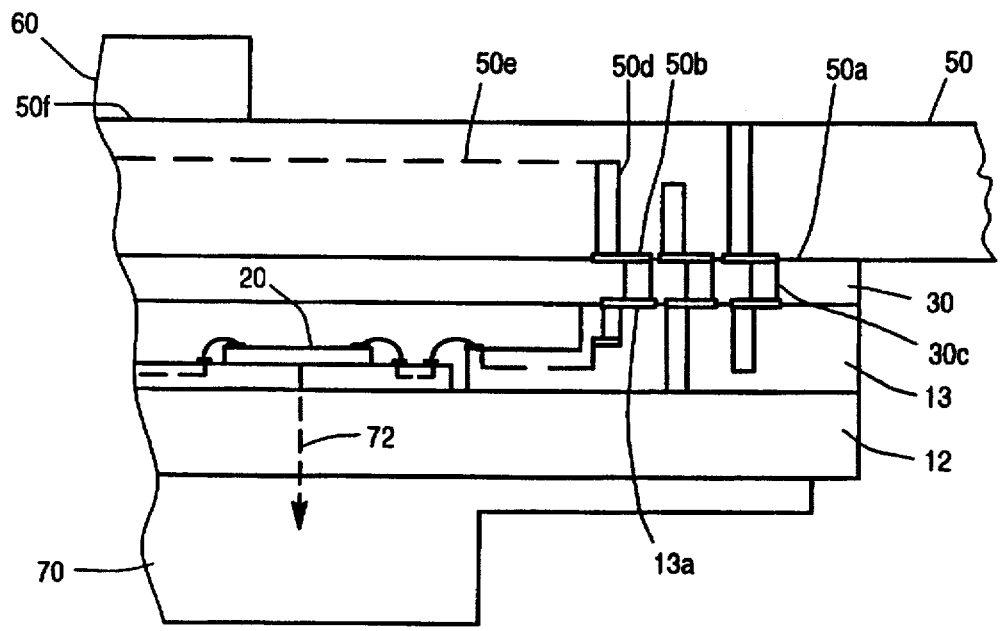
FIG. 3A is an enlarged sectional view which is the same as FIG. 2A except that the assembly has been expanded by connecting it to a printed circuit board, a pressure plate, and a heat sink.
Figure 3B:
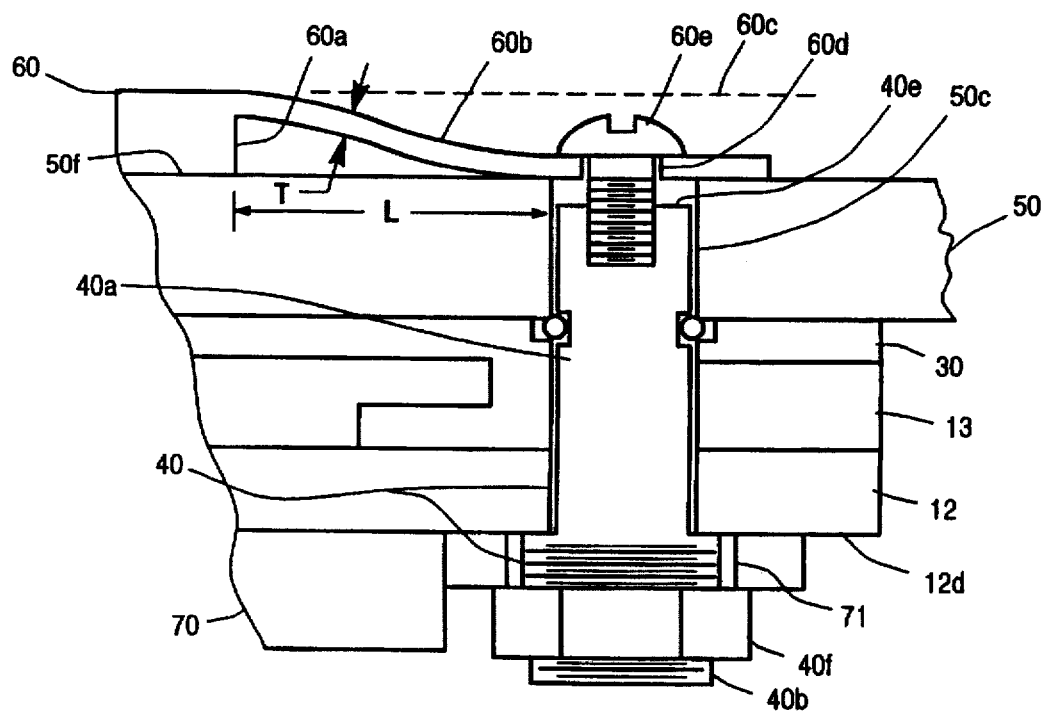
FIG. 3B is an enlarged sectional view of the FIG. 1 assembly which is the same as FIG. 3A except that the assembly has been expanded by connecting it to a printed circuit board, a pressure plate, and a heat sink.

Also as FIG. 2B shows, the shaft 40a of the alignment pin 40 extends above the lid 30; and the wide end 40b of the alignment pin 40 extends below the heat spreader 12. By these extended portions of the alignment pin 40, the electromechanical assembly of FIG. 1 can be expanded into a larger assembly as shown in FIGS. 3A and 3B. Those FIGS. 3A and 3B are enlarged sectional views which respectively are taken along section lines 2A and 2B in FIG. 1 after the assembly has been expanded by connecting additional components to the extended portions of the alignment pins 40. In FIGS. 3A and 3B, item 50 is a printed circuit board; item 60 is a pressure plate; and item 70 is a heat sink.

On one surface 50a of the printed circuit board 50 are a plurality of metal pads 50b which are arranged in the same pattern as the springs 30c within the lid 30. In order to make these metal pads 50b line up accurately with the springs 30c, the printed circuit board 50 is provided with alignment holes 50c which are precisely located with respect to the metal pads 50b; and the narrow shaft 40a of the alignment pins 40 fit snugly into the alignment holes 50c in the printed circuit board.

Any desired number of the FIG. 1 modules can be mounted as described above to the printed circuit board 50; and, electrical signals are sent between the modules by microscopic conductors which lie within the printed circuit board 50 and interconnect the metal pads 50b. An example of these conductors is identified in FIG. 3A by reference numerals 50d and 50e. Item 50d is a metal coated via hole in the printed circuit board 50 which extends perpendicularly from the metal pad 50b; and item 50e is a patterned conductor which runs parallel to surface 50a of the printed circuit board.

Also as shown in FIGS. 3A and 3B, the pressure plate 60 is comprised of two integrated sections 60a and 60b. Section 60a is a central section which rests against surface 50f of the printed circuit board 50; whereas section 60b is a peripheral section which has an unstressed state where it lies spaced apart from the surface 50f of the printed circuit board. For example, in the unstressed state, section 60b could lie along the dashed line 60c as shown in FIG. 3B.

Section 60b of the pressure plate 60 overlies all of the alignment pins 40, and it includes respective holes 60d which expose corresponding threaded ends 40e of the alignment pins 40. Section 60b of the pressure plate is connected to the threaded ends 40e of the alignment pins 40 by screws 60e. Each screw 60e is tightened until section 60b of the pressure plate is bent against surface 50f of the printed circuit board.

Heat sink 70 rests directly against the bottom surface 12d of the heat spreader 12; or alternatively, a thermal grease or thermal pad can lie there between. Heat sink 70 can be an air cooled heat sink or a liquid cooled heat sink, whichever is desired. To hold the heat sink 70 in place, it is provided with holes 71 through which the wide end 40b of the alignment pins pass; and a nut 40f screws on the wide end of the alignment pins and presses the heat sink 70 against the heat spreader 12.

One primary feature of the above-described electromechanical assembly of FIGS. 1–3B is that the lid 30 provides the dual functions of: a) covering the chips 20 to protect them in the housing 10, and b) carrying the conductive springs 30c which interconnect the metal pads 13a and 50b. Consequently, the disclosed assembly has a reduced component cost and a reduced cost of labor in manufacturing, in comparison to any alternative assembly which has a separate lid for the chip housing and a separate carrier for the springs 30a.

Also, another feature of the electromechanical assembly of FIGS. 1–3B is that it has a low profile in comparison to any alternative assembly in which the lid for the chip housing and carrier for the springs 30a are separate and lie on top of each other. Having a low profile is desirable because it shortens the length of the electrical conductors which run between the chips 20 and the printed circuit board 50, and thereby decreases parasitic capacitance and inductance. Also having a low profile is desirable because it increases the density with which several of the assemblies in FIGS. 1–3B can be mounted side-by-side in a rack and interconnected by a backplane.

Still another feature of the above-described electromechanical assembly is that each alignment pin 40 is a single part which serves multiple functions. These functions include—aligning the conductive springs 30c with the metal pads 13a and 50b; holding the lid 30 on the housing 10; attaching the housing 10 with its lid 30 to the printed circuit board 50; attaching the pressure plate 60 to the printed circuit board 50; and attaching the heat sink 70 to the heat spreader 12.

Another feature of the above-described electromechanical assembly is that it has a small footprint. By the term "footprint" is meant the area which the FIG. 1 components occupy on the printed circuit board 50. This small footprint is achieved because the alignment pins 40 are used to compress the springs 30c between the metal pads 13a and 50b, and these pins 40 lie within the perimeter of the springs 30c. Thus, no separate clamping mechanism is required which extends beyond the perimeter of the springs 30c in order to press the springs against the metal pads 50b in the printed circuit board.

Another feature of the above-described electromechanical assembly is that the pressure plate 60 insures that the conductive springs 30c are compressed between the metal pads 13a and 50b by a predetermined amount of force F. This force F is equal to the force which is required to bend section 60b of the pressure plate 60 against the printed circuit board 50. To increase the force F, the thickness T of section 60b can be increased and/or the length L of section 60b can be decreased; and vice-versa. Consequently, by preselecting the parameters T and L of the pressure plate 60, the housing 10 and printed circuit board 50 will not be over compressed and warped; and, the conductive springs 30c will not be under compressed and cause high resistance connections between the metal pads.

Yet another feature of the above-described electromechanical assembly is that the housing 10, the lid 30, and the printed circuit board 50 can all be connected together and taken apart multiple times without causing any damage to the conductive springs 30c in the lid 30. This feature is important because it enables any chip within the housing to be replaced when the chip becomes defective, and enables any chip within the housing to be replaced with an upgrade when such as upgrade becomes available. Preferably, this feature is achieved by providing the metal pads 13a and 50b with an oblong shape as shown in FIG. 4 wherein each metal pad has a wide end 80 and a narrow end 81.

One conductive spring 30c is centered on the wide end 80; and one metal-coated via hole 13f or 50d is centered on the narrow end 81. By offsetting the conductive springs 30c from the metal-coated via holes 13f or 50d, the springs do not get squeezed into the via holes where they could become wedged. Thus, the springs 30c do not get pulled out of the lid 30 when the housing 10 is removed from the printed circuit board 50.

Figure 4:
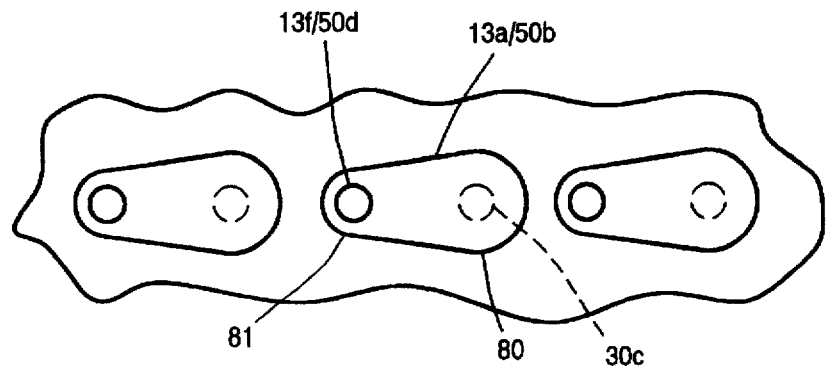
FIG. 4 shows the details of the metal pads which are in the FIG. 1 assembly.

With the metal pads 13a and 50b being shaped as shown in FIG. 4, the conductive springs 30c can be spaced in the lid 30 with a high density. For example, in one particular embodiment, the overall length of each metal pad is fifty mils; the spacing from one metal pad to the next metal pad is ten mils; the ends 80 and 81 of each metal pad respectively have a fifteen mil radius and a ten mil radius; the conductive springs have a ten mil radius; and the metal-coated visa have a five mil radius.

Still another feature of the above-described electromechanical assembly is that it provides a low thermal resistance path from the chips 20 to the heat sink 70. That thermal resistance path, as indicated by reference numeral 72 in FIG. 3A, passes perpendicularly through the substrate 11 and the heat spreader 12 to the heat sink 70.

One preferred embodiment of the invention has now been described in detail. In addition however, various changes and modifications can be made to the details of the described preferred embodiment without departing from the nature and spirit of the invention.

Figure 5:
FIG. 5 shows one alternative structure for the conductive springs which are in the FIG. 1 assembly.
Figure 6:
FIG. 6 shows another alternative structure for the conductive springs which are in the FIG. 1 assembly.

For example, in the preceding description of FIGS. 1–3A, each conductive spring 30c is described as being a wad of springy wire; but as an alternative, each conductive spring 30c can be replaced with the conductive spring 30c' of FIG. 5 or 30c" of FIG. 6. Spring 30c' has an S-shape; whereas spring 30c" has a C-shape. These springs 30c' and 30c" are held by themselves in the terminal holes 30a of the lid 30 as shown in FIGS. 5 and 6; or alternatively, they can be held in the terminal holes by an adhesive or an elastomer.

Figure 7:
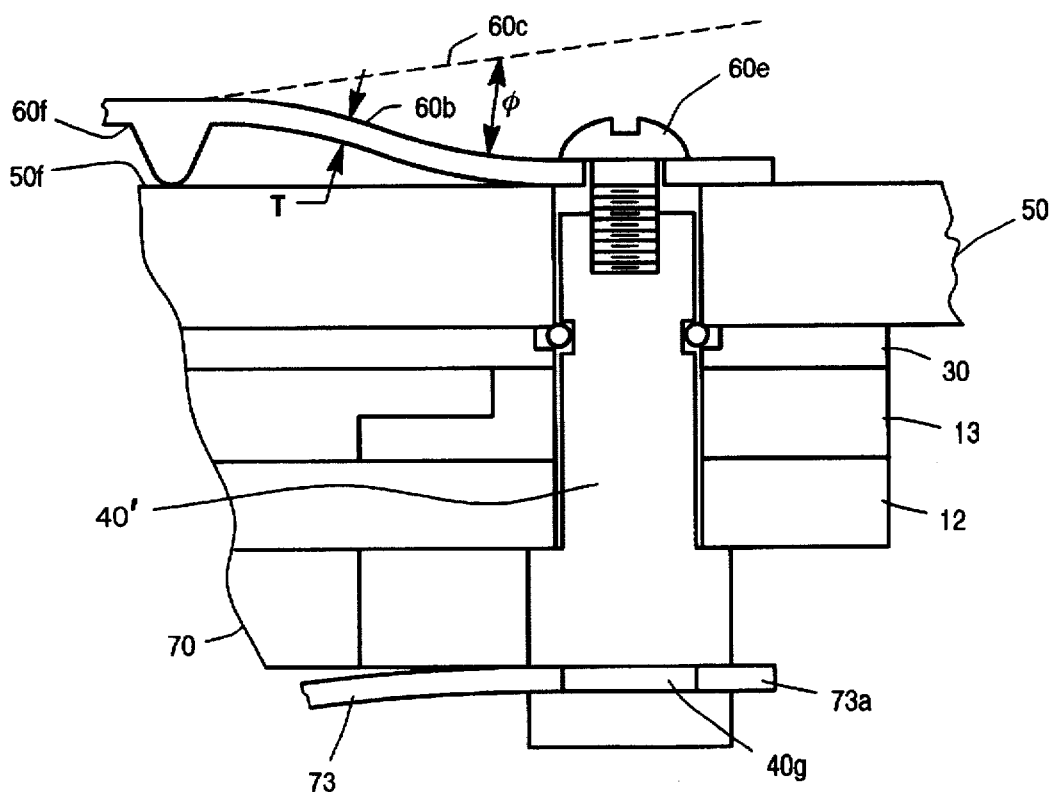
FIG. 7 is a sectional view which is the same as FIG. 3B except that it shows an alternative structure for the pressure plate and the heat sink attachment mechanism.

As another modification, the detailed make-up of the pressure plate 60 can be changed as shown in FIG. 7. There, the section of the pressure plate which rests against surface 50f of the printed circuit board is not flat, but instead it has bumps 60f which rest on surface 50f of the printed circuit board.

Using this embodiment, the electrically conductive springs 30c are compressed between the metal pads 13a and 50b with a predetermined force which can be increased by increasing the thickness T and/or increasing the bend angle ∅ from the unstressed position 60c, and/or increasing the ratio of $L_1+L_2$ (where $L_1$ is the distance between the bumps 60f and $L_2$ is the distance between the screws 60e. Preferably, each bump is located at the center of the effective opposing force which is exerted by the springs 30c, to thereby minimize a bending moment from being applied to the printed circuit board. For example, if four bumps 60f and two-hundred springs 30c are symmetrically arranged in the assembly, then each bump preferably is located at the center of the opposing force which is exerted by a contiguous group of fifty springs.

Also as another modification, the alignment pins 40 can be changed such that they attach to the heat sink 70 without the use of the nuts 40e. An example of this modification is shown in FIG. 7 wherein the heat sink 70 is held to modified alignment pins 40' by a springy retainer clip 73. This clip 73 is bent across the heat sink 70, and it has at least two hook-shaped ends 73a which catch in slots 40g on the wide end of the modified alignment pin 40'.

Accordingly, since many such modifications can be made to the details which are illustrated in FIGS. 1 through 7, it is to be understood that the invention is not limited to those details, but is defined by the appended claims.

What is claimed is:

1. A pressure-mountable, electro-mechanical assembly which is comprised of:

an integrated circuit chip;

a housing which holds said chip in an open cavity, and which has conductors that connect said chip to a pattern of flat metal pads which lie on an exterior surface of said housing around said open cavity;

a lid which covers said cavity, lies on said exterior surface around said cavity, and has terminal holes that match and expose said pattern of metal pads;

respective conductive springs which are held in said terminal holes, contact said metal pads, and project from said lid;

a single set of alignment holes, through said lid and said housing, which line up only when said conductive springs are aligned with said metal pads; and, a single set of pins which extend completely through said alignment holes and which are threaded for connection to other components in said assembly; each pin having a wide end which is too wide to pass through said holes, and having a narrow end with a retainer which holds said lid and said housing together.

2. An electromechanical assembly according to claim 1 and further including a printed circuit board which has metal pads that are arranged in the same pattern as said springs in said lid, and wherein said printed circuit board also has alignment holes that are filled by said single set of pins to thereby position said springs on said metal pads of said printed circuit board.

3. An electromechanical assembly according to claim 2 and further including a pressure plate which has a first section that rests against said printed circuit board and a second section that is spaced apart from said printed circuit board; and wherein a fastener on said threads of said pins compress said springs between said metal pads with a predetermined force by bending said second section of said pressure plate toward said printed circuit board.

4. An electromechanical assembly according to claim 3 and further including a heat sink which is held by said single set of pins against said housing.

5. An electromechanical assembly according to claim 1 and further including a pressure plate which has a first section that is coupled to said housing and a second section that is spaced apart from said housing and coupled to said alignment pins with screws; and wherein to compress said springs on said metal pads with a predetermined force, said second section of said pressure plate is bent toward said housing by tightening said screws.

6. An electromechanical assembly according to claim 1 wherein each spring is a wad of springy wire.

7. An electromechanical assembly according to claim 1 wherein each spring is an S-shaped spring.

8. An electromechanical assembly according to claim 1 wherein each spring is a C-shaped spring.

9. A pressure-mountable, electro-mechanical assembly which is comprised of:

an integrated circuit chip;

a housing which holds said chip in an open cavity, and which has conductors that connect said chip to a pattern of metal pads on an exterior surface of said housing;

a lid which lies on said exterior surface, covers said cavity, and has terminal holes that match and expose said pattern of metal pads;

respective conductive springs which are held in said terminal holes, contact said metal pads, and project from said lid;

a pressure plate which has a first section that is coupled to said housing, and a second section which has an unstressed state in which said second section lies spaced apart from said housing; and, a bending means which compresses said springs on said metal pads with a predetermined force by bending said second section of said pressure plate toward said housing.

* * * * *